(12) United States Patent
Harada et al.

(10) Patent No.: US 11,776,609 B2
(45) Date of Patent: Oct. 3, 2023

(54) MEMORY-ELEMENT-INCLUDING SEMICONDUCTOR DEVICE

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 17/717,808

(22) Filed: Apr. 11, 2022

(65) Prior Publication Data

US 2022/0336003 A1     Oct. 20, 2022

(30) Foreign Application Priority Data

Apr. 15, 2021   (WO) .................. PCT/JP2021/015333

(51) Int. Cl.
*G11C 11/402*     (2006.01)
*G11C 11/409*     (2006.01)

(52) U.S. Cl.
CPC ........ *G11C 11/4023* (2013.01); *G11C 11/409* (2013.01)

(58) Field of Classification Search
CPC .......................... G11C 11/4023; G11C 11/409
(Continued)

(56) References Cited

U.S. PATENT DOCUMENTS

2003/0111681 A1   6/2003   Kawanaka
2006/0049444 A1   3/2006   Shino
(Continued)

FOREIGN PATENT DOCUMENTS

JP   H 02-188966 A   7/1990
JP   H 03-171768 A   7/1991
(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, vol. 38, No. 3, pp. 573-578 (1991).

H. Chung, H. Kim, H. Kim, K. Kim, S. Kim, K. Dong, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

(Continued)

*Primary Examiner* — Huan Hoang
(74) *Attorney, Agent, or Firm* — Crowell & Moring LLP

(57) ABSTRACT

In a dynamic flash memory cell including: a $HfO_2$ layer and a TiN layer surrounding a lower portion of a Si pillar standing on a P-layer substrate; a $HfO_2$ layer surrounding an upper portion of the Si pillar; a TiN layer; and $N^+$ layers connected to a bottom portion and a top portion of the Si pillar, and an SGT transistor including: a $SiO_2$ layer surrounding a lower portion of a Si pillar standing on the same P-layer substrate; a $HfO_2$ layer surrounding an upper portion of the Si pillar; a TiN layer; and $N^+$ layers sandwiching the $HfO_2$ layer in a perpendicular direction and connected to a top portion and a middle portion of the Si pillar, bottom positions of the Si pillar and the Si pillar are at the same position A. A bottom portion of an upper transistor portion of the dynamic flash memory cell composed of the $HfO_2$ layer and the TiN layer in an upper portion of the Si pillar, and a bottom portion of an SGT transistor portion composed of the $HfO_2$ layer and the TiN layer in an upper portion of the Si pillar are at the same position B.

7 Claims, 16 Drawing Sheets

(58) Field of Classification Search
USPC ......................................................... 365/149
See application file for complete search history.

(56) References Cited

U.S. PATENT DOCUMENTS

| | | |
|---|---|---|
| 2008/0137394 A1 | 6/2008 | Shimano |
| 2008/0212366 A1 | 9/2008 | Ohsawa |
| 2008/0239789 A1 | 10/2008 | Shino et al. |
| 2009/0032849 A1* | 2/2009 | Higashino ............ H01L 29/7827 438/192 |
| 2015/0311295 A1* | 10/2015 | Lee ....................... H01L 29/407 438/586 |
| 2017/0309632 A1 | 10/2017 | Masuoka et al. |

FOREIGN PATENT DOCUMENTS

| | | |
|---|---|---|
| JP | 2003-188279 A | 7/2003 |
| JP | 2006-080280 A | 3/2006 |
| JP | 3957774 B2 | 8/2007 |
| JP | 2008-124209 A | 5/2008 |
| JP | 2008-147514 A | 6/2008 |
| JP | 2008-218556 A | 9/2008 |
| WO | WO 2016-162927 A1 | 10/2016 |

OTHER PUBLICATIONS

H. S. Philip Wong, S. Raoux, S. Kim, Jiale Liang, J. R. Reifenberg, B. Rajendran, M. Asheghi and K. E. Goodson: "Phase Change Memory," Proceeding of IEEE, vol. 98, No. 12, December, pp. 2201-2227 (2010).

T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama : "Low Power and high Speed Switching of Ti-doped NiO ReRAM under the Unipolar Voltage Source of less than 3V," IEDM (2007).

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosum, K. Lim, C. Park, J. Oh, p. Kirsch, and K. C. Saraswat: "Novel Capacitorless Single-Transistor Charge-Trap Dram (1T CT DRAM) Utilizing Electron," IEEE Electron Device Letter, vol. 31, No. 5, pp. 405-407 (2010).

J. Wan, L. Rojer, A. Zaslavsky, and S. Critoloveanu: "A Compact Capacitor-Less High-Speed DRAM Using Field Effect-Controlled Charge Regeneration," Electron Device Letters, vol. 35, No. 2, pp. 179-181 (2012).

T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).

T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama "Floating Body RAM Technology and its Scalability to 32nm Node and Beyond," IEEE IEDM (2006).

E. Yoshida and T. Tanaka: "A Design of a Capacitorless 1T-DRAM Cell Using Gate-induced Drain Leakage (GIDL) Current for Low-power and High-speed Embedded Memory," IEEE IEDM, pp. 913-916, Dec. 2003.

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007).

Asen Asenov, Binjie Cheng, Xingsheng Wang, Andrew Robert Brown, Campbell Millar, Craig Alexander, Salvatore Maria Amoroso, Jente B. Kuang, and Sani R. Nassif,"Variability Aware Simulation Based Design-Technology Cooptimization (DTCO) Flow in 14 nm FinFET/SRAM Cooptimization," IEEE Transaction on Electron Devices, vol. 62,No. 6(2015).

K.J. Yang, R.N. Gupta, S. Banna, F. Nemati, H.-J. Cho, M. Ershov, M. Tarabbia, D. Hayes, and S.T. Robins, "Optimization of Nanoscale Thyristors on SOI for High-Performance High-Density Memories",2006 IEEE International SOI Conference Proceedings, pp. 129-130 (2006).

Initial Patent Examination Report from PCT/JP2021/015529, dated Apr. 15, 2021, 4 pgs.

F. Morishita, H. Noda, I. Hayashi, T. Gyohten, M. Okamoto, T. Ipposhi, S. Maegawa, K. Dosaka, and K. Arimoto: "A Capacitorless Twin-Transistor Random Access Memory (TTRAM) on SOI," IEICE Trans. Electron., vol. E90-c., No. 4 pp. 765-771 (2007) a brief description attached.

* cited by examiner

"1" WRITE STATE

"0" ERASE OPERATION

Vb: Built-in Voltage~0.7V
Built-in Voltage-0.7 V

"1" WRITE OPERATION

SOURCE-SIDE IMPACT IONIZATION

"1" WRITE STATE

"1" WRITE STATE

"0" ERASE STATE

Vb: Built-in Voltage-0.7 V

BL: BIT LINE
SL: SOURCE LINE
WL: WORD LINE
PL: PLATE LINE
FB: FLOATING BODY $$C_{FB} = C_{PL} + C_{WL} + C_{BL} + C_{SL}$$

$$\Delta V_{FB} = V_{FB2} - V_{FB1}$$

$$= \frac{C_{WL}}{C_{PL} + C_{WL} + C_{BL} + C_{SL}} \times V_{ReadWL} \quad (1)$$

$$C_{FB} = C_{WL} + C_{BL} + C_{SL} \quad \text{EQUATION (1)}$$

$$\Delta V_{FB} = V_{FB2} - V_{FB1}$$

$$= \frac{C_{WL}}{C_{WL} + C_{BL} + C_{SL}} \times V_{ProgWL} \quad \text{EQUATION (2)}$$

$$\beta = \frac{C_{WL}}{C_{WL} + C_{BL} + C_{SL}} \quad \text{EQUATION (3)}$$

MEMORY-ELEMENT-INCLUDING SEMICONDUCTOR DEVICE

CROSS-REFERENCE TO RELATED APPLICATIONS

This application claims priority claims priority under 35 U.S.C. § 119(a) to PCT/JP2021/015533 filed on Apr. 15, 2021, the entire content of which is incorporated herein by reference.

TECHNICAL FIELD

The present invention relates to a memory-element-including semiconductor device.

BACKGROUND ART

In recent years, higher integration and higher performance of a memory-element-including semiconductor device have been demanded in the development of the LSI (Large Scale Integration) technology.

In a typical planar MOS transistor, a channel extends in a horizontal direction along an upper surface of a semiconductor substrate. On the other hand, a channel of an SGT extends in a direction perpendicular to an upper surface of a semiconductor substrate (see, for example, PTL 1 and NPL 1). Thus, in the SGT, the density of a semiconductor device can be increased compared with the planar MOS transistor. By using the SGT as a selection transistor, it is possible to achieve higher integration of a DRAM (Dynamic Random Access Memory, see, for example, NPL 2) to which a capacitor is connected, a PCM (Phase Change Memory, see, for example, NPL 3) to which a resistance change element is connected, an RRAM (Resistive Random Access Memory, see, for example, NPL 4), an MRAM (Magnetoresistive Random Access Memory, see, for example, NPL 5) in which a resistance is changed by changing the orientation of a magnetic spin by using a current, and the like. In addition, there is a capacitorless DRAM memory cell constituted by a single MOS transistor (see NPL 6), for example. The present application relates to a semiconductor device including a dynamic flash memory that does not include a resistance change element or a capacitor and that can be constituted by a MOS transistor alone.

FIGS. 7A-7D illustrate a write operation of the above-described capacitorless DRAM memory cell constituted by a single MOS transistor, FIGS. 8A-8B illustrate a problem in the operation, and FIGS. 9A-9C illustrate a read operation (see NPLs 6 to 10).

FIGS. 7A-7D illustrate the write operation of the DRAM memory cell. FIG. 7A illustrates a "1" write state. The memory cell herein is formed on an SOI substrate 101 and is constituted by a source N$^+$ layer 103 (hereinafter, a semiconductor region containing donor impurities at high concentration will be referred to as an "N$^+$ layer") to which a source line SL is connected, a drain N$^+$ layer 104 to which a bit line BL is connected, a gate conductive layer 105 to which a word line WL is connected, and a floating body 102 of a MOS transistor 110a. The DRAM memory cell does not include a capacitor and is constituted by the single MOS transistor 110a. The SiO$_2$ layer of the SOI substrate 101 is immediately under the floating body 102 and is in contact with the floating body 102. To write "1" in the memory cell constituted by the single MOS transistor 110a, the MOS transistor 110a is operated in a saturation region. That is, an electron channel 107 extending from the source N$^+$ layer 103 has a pinch-off point 108 and does not reach the drain N$^+$ layer 104 to which the bit line BL is connected. When the MOS transistor 110a is operated such that the bit line BL connected to the drain N$^+$ layer 104 and the word line WL connected to the gate conductive layer 105 are both at a high voltage and that the gate voltage is about ½ of the drain voltage, the electric field strength becomes maximum at the pinch-off point 108 near the drain N$^+$ layer 104. As a result, accelerated electrons flowing from the source N$^+$ layer 103 toward the drain N$^+$ layer 104 collide with a Si lattice, and the kinetic energy lost at the time generates electron-hole pairs (impact ionization phenomenon). Most of the generated electrons (not illustrated) reach the drain N$^+$ layer 104. A very small portion of the electrons, which is very hot, jumps over a gate oxide film 109 and reaches the gate conductive layer 105. Holes 106 generated simultaneously charge the floating body 102. In this case, the generated holes 106 contribute as an increment of a majority carrier because the floating body 102 is made of P-type Si. When the floating body 102 is filled with the generated holes 106 and the voltage of the floating body 102 becomes higher than that of the source N$^+$ layer 103 by Vb or more, holes further generated are discharged to the source N$^+$ layer 103. Here, Vb is a built-in voltage of the PN junction between the source N$^+$ layer 103 and the floating body 102 as a P layer, and is about 0.7 V. FIG. 7B illustrates a state in which the floating body 102 is charged to saturation with the generated holes 106.

Next, a "0" write operation of the memory cell 110 will be described with reference to FIG. 7C. For a selected common word line WL, there are randomly a memory cell 110a for writing "1" and a memory cell 110b for writing "0". FIG. 7C illustrates a state of rewriting from a "1" write state to a "0" write state. To write "0", the voltage of the bit line BL is negatively biased and the PN junction between the drain N$^+$ layer 104 and the floating body 102 as a P layer forward biased. As a result, the holes 106 generated in the floating body 102 in advance in the previous cycle flow into the drain N$^+$ layer 104 connected to the bit line BL. Upon completion of the write operation, two memory cell states are obtained: the memory cell 110a filled with the generated holes 106 (FIG. 7B); and the memory cell 110b from which the generated holes 106 have been discharged (FIG. 7C). The floating body 102 of the memory cell 110a filled with the holes 106 has a potential higher than that of the floating body 102 having no generated holes. Thus, a threshold voltage of the memory cell 110a is lower than a threshold voltage of the memory cell 110b. This state is illustrated in FIG. 7D.

Next, a problem in the operation of the memory cell constituted by the single MOS transistor will be described with reference to FIGS. 8A-8B. As illustrated in FIG. 8A, a capacitance $C_{FB}$ of the floating body 102 is the sum of a capacitance $C_{WL}$ between the gate to which the word line is connected and the floating body 102, a junction capacitance $C_{SL}$ of the PN junction between the source N$^+$ layer 103 to which the source line is connected and the floating body 102, and a junction capacitance $C_{BL}$ of the PN junction between the drain N$^+$ layer 103 to which the bit line is connected and the floating body 102, and is expressed by the following equation.

$$C_{FB}=C_{WL}+C_{BL}+C_{SL} \qquad (1)$$

Thus, if a word line voltage $V_{WL}$ oscillates at the time of writing, the oscillation affects the voltage of the floating body 102 serving as a storage node (contact point) of the memory cell. This state is illustrated in FIG. 8B. In accordance with an increase in the word line voltage $V_{WL}$ from 0 V to $V_{ProgWL}$ at the time of writing, a voltage $V_{FB}$ of the floating body 102 increases from a voltage $V_{FB1}$ in an initial state before the word line voltage changes to $V_{FB2}$ due to capacitive coupling with the word line. The voltage change amount $\Delta V_{FB}$ is expressed by the following equation.

$$\Delta V_{FB} = V_{FB2} - V_{FB1} \qquad (2)$$
$$= C_{WL}/(C_{WL} + C_{BL} + C_{SL}) \times V_{ProgWL}$$

Here, $$\beta = C_{WL}/(C_{WL} + C_{BL} + C_{SL}) \qquad (3)$$

is expressed, where β represents a coupling ratio. In such a memory cell, $C_{WL}$ has a high contribution ratio, for example, $C_{WL}:C_{BL}:C_{SL}=8:1:1$. In this case, β equals 0.8. When the word line changes, for example, from 5 V at the time of writing to 0 V after the end of writing, the capacitive coupling between the word line and the floating body 102 causes the floating body 102 to be subjected to oscillation noise of 5 V×β=4 V. This involves a problem that a sufficient potential difference margin is not provided between the "1" potential and the "0" potential of the floating body 102 at the time of writing.

FIGS. 9A-9C illustrate the read operation. FIG. 9A illustrates a "1" write state, and FIG. 9B illustrates a "0" write state. Actually, however, even if Vb is written in the floating body 102 by "1" writing, the floating body 102 is lowered to a negative bias when the word line returns to 0 V upon completion of writing. When "0" is written, the floating body 102 is further negatively biased, and thus it is impossible to provide a sufficiently large potential difference margin between "1" and "0" at the time of writing. The small operation margin is a major problem of the DRAM memory cell. In addition, how to form a peripheral circuit for driving the DRAM memory cell on the same substrate is an issue.

CITATION LIST

Patent Literature

[PTL 1] Japanese Unexamined Patent Application Publication No. 2-188966
[PTL 2] Japanese Unexamined Patent Application Publication No. 3-171768
[PTL 3] Japanese Patent No. 3957774

Non Patent Literature

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3 V," IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[NPL 7] J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012)
[NPL 8] T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002).
[NPL 9] T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006).
[NPL 10] E. Yoshida: "A Capacitorless 1T-DRAM Technology Using Gate-Induced Drain-Leakage (GIDL) Current for Low-Power and High-Speed Embedded Memory," IEEE IEDM (2006).
[NPL 11] E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.
[NPL 12] Asen Asenov, Binjie Cheng, XingshengWang, Andrew Robert Brown, Campbell Millar, Craig Alexander, Salvatore Maria Amoroso, Jente B. Kuang, and Sani R. Nassif, "Variability Aware Simulation Based Design-Technology Cooptimization (DTCO) Flow in 14 nm FinFET/SRAM Cooptimization," IEEE Transaction on Electron Devices, Vol. 62, No. 6 (2015)
[NPL 13] K. J. Yang, R. N. Gupta, S. Banna, F. Nemati, H.-J. Cho, M. Ershov, M. Tarabbia, D. Hayes, and S. T. Robins, "Optimization of Nanoscale Thyristors on SOI for High-Performance High-Density Memories", 2006 IEEE International SOI Conference Proceedings, pp. 129-130 (2006)

SUMMARY OF INVENTION

Technical Problem

A capacitorless single-transistor DRAM (gain cell) serving as a memory device including an SGT has a problem that oscillation of the potential of the word line at the time of reading or writing data is directly transmitted as noise to a floating SGT body because the capacitive coupling between the word line and the SGT body is large. This results in a problem of erroneous reading or erroneous rewriting of stored data, and difficulty in putting a capacitorless single-transistor DRAM (gain cell) into practical use. In addition to solving the above problem, it is necessary to form a memory cell and a peripheral circuit for driving the memory cell on the same substrate at high density and low cost.

Solution to Problem

To solve the above problem, a memory-element-including semiconductor device according to the present invention is a memory-element-including semiconductor device including a dynamic flash memory cell and an SGT transistor, in which the dynamic flash memory cell includes a first semiconductor pillar standing on a substrate in a direction perpendicular to the substrate, a first impurity layer connected to a bottom portion of the first semiconductor pillar, a second impurity layer disposed at or connected to a top portion of the first semiconductor pillar, a first gate insulating layer surrounding a lower portion of the first semiconductor pillar and being in contact with the first impurity layer, a second gate insulating layer being in contact with the first gate insulating layer and surrounding an upper portion of the first semiconductor pillar, a first gate conductor layer surrounding the first gate insulating layer, a second gate conductor layer surrounding the second gate insulating layer, and a first insulating layer disposed between the first gate conductor layer and the second gate conductor layer, the dynamic flash memory cell is configured to perform a memory write operation, a memory erase operation, and a memory read operation by controlling voltages to be applied to the first impurity layer, the second impurity layer, the first gate conductor layer, and the second gate conductor layer, the SGT transistor includes a second semiconductor pillar standing on the substrate in a direction perpendicular to the substrate, a second insulating layer surrounding a lower portion of the second semiconductor pillar, a third impurity layer connected to a lower end of a region of the second semiconductor pillar, the region being above the second insulating layer, a fourth impurity layer connected to an upper end thereof, a third gate insulating layer surrounding a region of the second semiconductor pillar, the region being between the third impurity layer and the fourth impurity layer, and a third gate conductor layer surrounding the third gate insulating layer, and bottom portions of the first semiconductor pillar and the second semiconductor pillar are disposed at the same position in the perpendicular direction, and top portions of the first semiconductor pillar and the second semiconductor pillar are disposed at the same position in the perpendicular direction (first invention).

In the above-described first invention, a lower-end position of the second gate conductor layer and a lower-end position of the third gate conductor layer are the same in the perpendicular direction (second invention).

In the above-described first invention, the second impurity layer and the fourth impurity layer are at the same position in the perpendicular direction (third invention).

In the above-described first invention, the second impurity layer and the fourth impurity layer contain the same donor impurity atoms and are made of the same semiconductor base material (fourth invention).

In the above-described first invention, the dynamic flash memory cell is configured to perform an operation of generating an electron group and a hole group in the first semiconductor pillar by causing an impact ionization phenomenon using a current flowing between the first impurity layer and the second impurity layer or by causing a gate induced drain leakage current; the memory write operation of discharging, of the electron group and the hole group that have been generated, the electron group or the hole group as a minority carrier from the first semiconductor pillar and causing the hole group or the electron group as a majority carrier to remain in the first semiconductor pillar; and the memory erase operation of discharging the hole group or the electron group as a majority carrier from the first semiconductor pillar (fifth invention).

In the above-described first invention, a first gate capacitance between the first gate conductor layer and the first semiconductor pillar is higher than a second gate capacitance between the second gate conductor layer and the first semiconductor pillar (sixth invention).

In the above-described first invention, the first impurity layer and the second impurity layer are each an N-type semiconductor layer containing a large number of donor impurities, and the first semiconductor pillar is a P-type semiconductor layer containing an acceptor impurity (seventh invention).

DESCRIPTION OF EMBODIMENTS

Hereinafter, the structure and operation of a memory device using a semiconductor element (hereinafter referred to as a dynamic flash memory) according to embodiments of the present invention will be described with reference to the drawings. In addition, the structure and manufacturing method of the dynamic flash memory cell and an SGT transistor used for a driving circuit and a signal processing circuit connected to the dynamic flash memory cell and provided on the same substrate will be described with reference to the drawings.

First Embodiment

The structure and operation mechanism of a dynamic flash memory cell according to a first embodiment of the present invention will be described with reference to FIG. 1 to FIGS. 5A-5D. The structure of the dynamic flash memory cell will be described with reference to FIG. 1. A data erase mechanism will be described with reference to FIGS. 2A-2C, a data write mechanism will be described with reference to FIGS. 3A-3C, and a data read mechanism will be described with reference to FIGS. 4AA-4AC and FIGS. 4BA-4BD. The structure of the memory cell of the dynamic flash memory and the SGT transistor formed on the same substrate will be described with reference to FIGS. 5A-5D.

Figure 1:
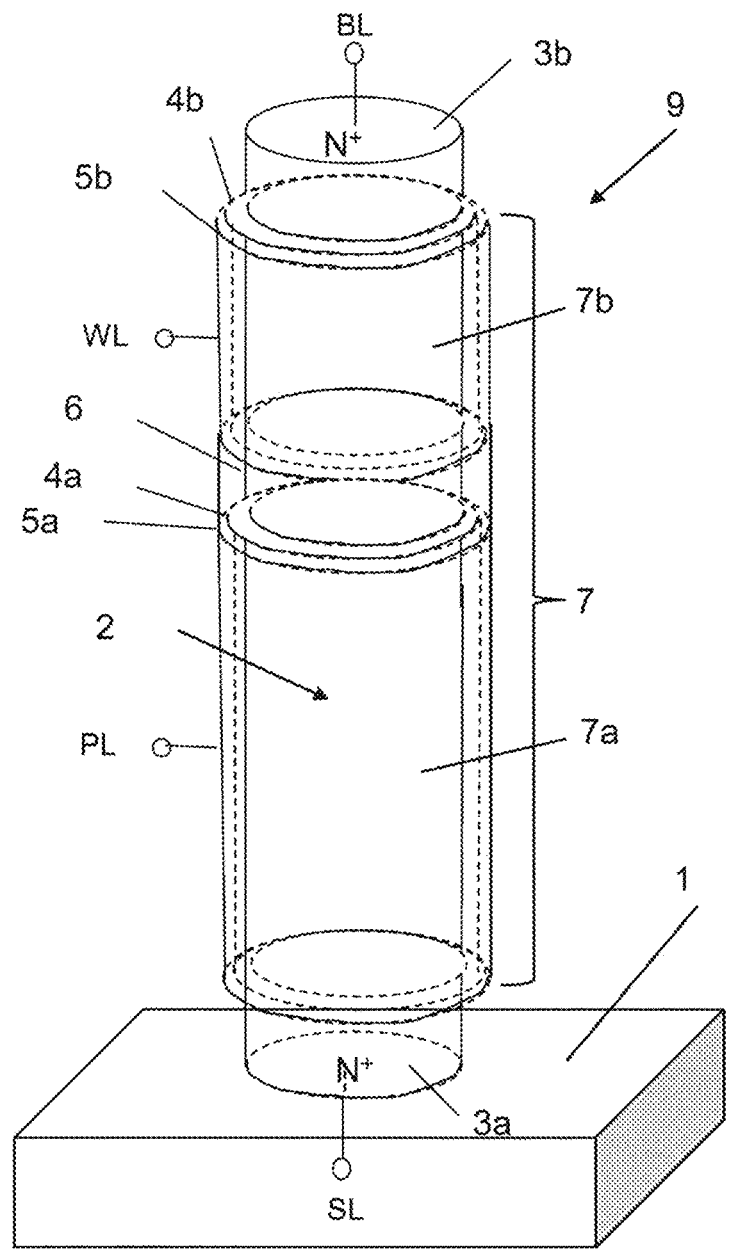
FIG. 1 is a structural diagram of a dynamic flash memory device according to a first embodiment.

FIG. 1 illustrates the structure of the dynamic flash memory cell according to the first embodiment of the present invention. On a substrate 1 (an example of "substrate" in the claims), a silicon pillar 2 (an example of "first semiconductor pillar" in the claims) having a conductivity type of P type or i type (intrinsic type) (hereinafter, a silicon pillar will be referred to as a "Si pillar"), an $N^+$ layer 3a (an example of "first impurity layer" in the claims) connected to a bottom portion of the Si pillar 2, and an $N^+$ layer 3b (an example of "second impurity layer" in the claims) connected to a top portion of the Si pillar 2 are formed upward. When one of the $N^+$ layer 3a and the $N^+$ layer 3b serves as a source, the other serves as a drain. In the Si pillar 2, the region between the $N^+$ layer 3a and the $N^+$ layer 3b serves as a channel region 7. A first gate insulating layer 4a (an example of "first gate insulating layer" in the claims) surrounding a lower portion of the Si pillar 2, and a second gate insulating layer 4b (an example of "second gate insulating layer" in the claims) surrounding an upper portion of the Si pillar 2 are formed. The first gate insulating layer 4a and the second gate insulating layer 4b are respectively in contact with or close to the $N^+$ layers 3a and 3b serving as the source and the drain. A first gate conductor layer 5a (an example of "first gate conductor layer" in the claims) surrounding the first gate insulating layer 4a, and a second gate conductor layer 5b (an example of "second gate conductor layer" in the claims) surrounding the second gate insulating layer 4b are formed. The first gate conductor layer 5a and the second gate conductor layer 5b are isolated from each other by an insulating layer 6 (an example of "first insulating layer" in the claims). The channel region 7 is composed of a first channel region 7a surrounded by the first gate insulating layer 4a, and a second channel region 7b surrounded by the second gate insulating layer 4b. Accordingly, a dynamic flash memory cell 9 composed of the $N^+$ layers 3a and 3b serving as the source and the drain, the channel region 7, the first gate insulating layer 4a, the second gate insulating layer 4b, the first gate conductor layer 5a, and the second gate conductor layer 5b is formed. The $N^+$ layer 3a is connected to a source line SL, the $N^+$ layer 3b is connected to a bit line BL, the first gate conductor layer 5a is connected to a plate line PL, and the second gate conductor layer 5b is connected to a word line WL. The substrate 1 is a base material layer that is connected to the Si pillar 2 standing in a perpendicular direction and that has an upper surface extending in a horizontal direction. Thus, of the $N^+$ layer 3a, a portion below the surface of the substrate 1 in the perpendicular direction is regarded as the substrate 1. The portion of the $N^+$ layer 3a in the substrate 1 may extend in the horizontal direction. In addition, the substrate 1 may be formed of SOI (Silicon On Insulator), a single layer or a plurality of layers of Si, or another semiconductor material. In addition, the substrate 1 may be a well layer composed of one or a plurality of N layers or P layers.

Figure 2A:
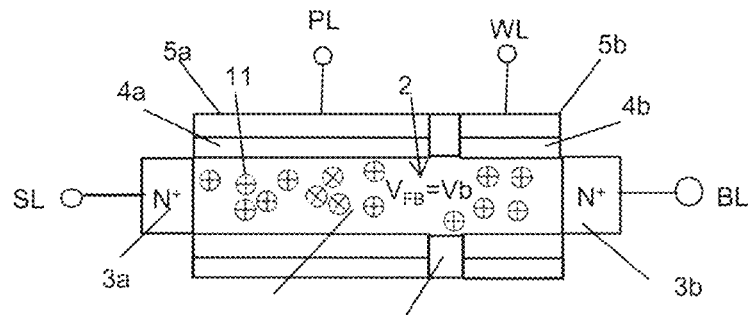
FIGS. 2A, 2B and 2C are diagrams for describing an erase operation mechanism of the dynamic flash memory device according to the first embodiment.
Figure 2B:
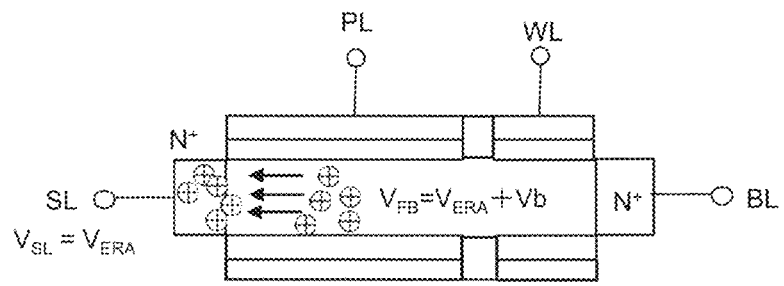
Figure 2C:
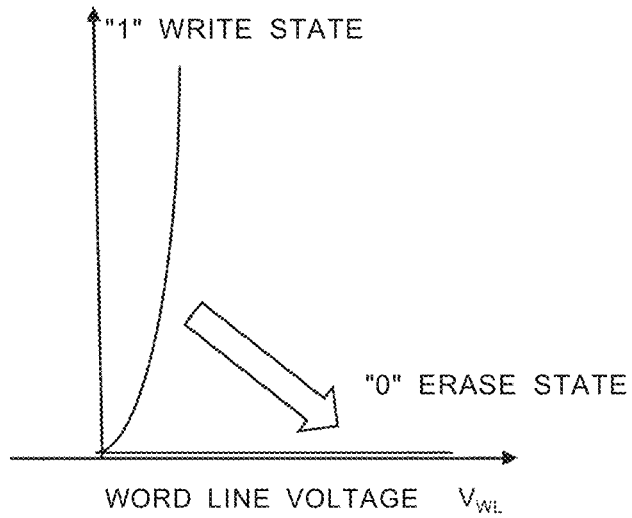

An erase operation mechanism will be described with reference to FIGS. 2A-2C. The channel region 7 between the $N^+$ layers 3a and 3b is electrically isolated from the substrate 1 and serves as a floating body. FIG. 2A illustrates a state in which a hole group 11 generated by impact ionization in the previous cycle is stored in the channel region 7 before an erase operation. As illustrated in FIG. 2B, the voltage of the source line SL is set to a negative voltage $V_{ERA}$ at the time of the erase operation. Here, $V_{ERA}$ is −3 V, for example. As a result, regardless of the value of an initial potential of the channel region 7, the PN junction between the $N^+$ layer 3a connected to the source line SL and serving as the source and the channel region 7 is forward biased. As a result, the hole group 11 generated by impact ionization in the previous cycle and stored in the channel region 7 is drawn into the $N^+$ layer 3a serving as a source portion, and a potential $V_{FB}$ of the channel region 7 becomes $V_{FB}=V_{ERA}+Vb$. Here, Vb is a built-in voltage of the PN junction and is about 0.7 V. Thus, in the case of $V_{ERA}=-3$ V, the potential of the channel region 7 is −2.3 V. This value corresponds to the potential state of the channel region 7 in an erase state. Thus, when the potential of the channel region 7 of the floating body becomes a negative voltage, the threshold voltage of the N-channel MOS transistor of the dynamic flash memory cell 9 increases due to a substrate bias effect. Accordingly, the threshold voltage of the second gate conductor layer 5b to which the word line WL is connected increases as illustrated in FIG. 2C. The erase state in the channel region 7 corresponds to logical storage data "0". In data reading, the voltage applied to the first gate conductor layer 5a connected to the plate line PL is set to be higher than the threshold voltage at the time of logical storage data "1" and lower than the threshold voltage at the time of logical storage data "0", and thereby a characteristic is obtained in which, as illustrated in FIG. 2C, no current flows even if the voltage of the word line WL is increased in reading of logical storage data "0". The above-described conditions of the voltages applied to the bit line BL, the source line SL, the word line WL, and the plate line PL are examples for performing an erase operation, and other operation conditions for performing the erase operation may be used. For example, the erase operation may be performed with a voltage difference being applied between the bit line BL and the source line SL.

Figure 3A:
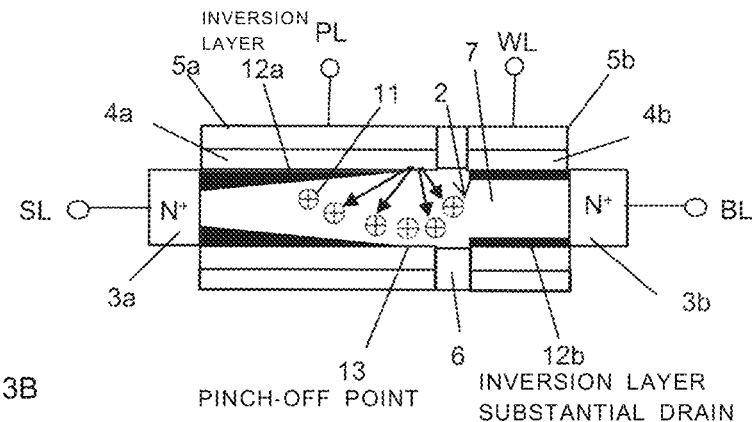
FIGS. 3A, 3B and 3C are diagrams for describing a write operation mechanism of the dynamic flash memory device according to the first embodiment.
Figure 3B:
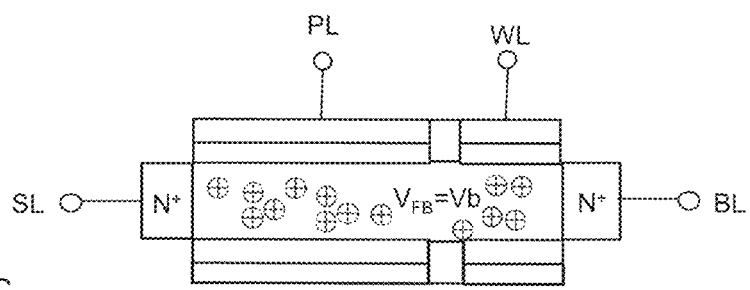
Figure 3C:
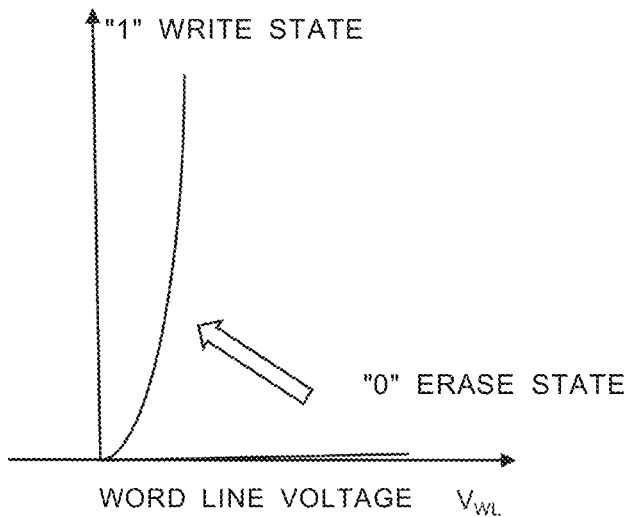

FIGS. 3A-3C illustrate a write operation of the dynamic flash memory cell according to the first embodiment of the present invention. As illustrated in FIG. 3A, for example, 0 V is input to the $N^+$ layer 3a to which the source line SL is connected, for example, 3 V is input to the $N^+$ layer 3b to which the bit line BL is connected, for example, 2 V is input to the first gate conductor layer 5a to which the plate line PL is connected, and for example, 5 V is input to the second gate conductor layer 5b to which the word line WL is connected. As a result, as illustrated in FIG. 3A, an inversion layer 12a is formed on an inner side from the first gate conductor layer 5a to which the plate line PL is connected, and a first N-channel MOS transistor region composed of the first channel region 7a (see FIG. 1) surrounded by the first gate conductor layer 5a is operated in a saturation region. As a result, a pinch-off point 13 is present in the inversion layer 12a on an inner side from the second gate conductor layer 5b to which the plate line PL is connected. On the other hand, a second N-channel MOS transistor region composed of the second channel region 7b (see FIG. 1) surrounded by the second gate conductor layer 5b to which the word line WL is connected is operated in a linear region. As a result, a pinch-off point is absent on an inner side from the second gate conductor layer 5b to which the word line WL is connected, and an inversion layer 12b is formed over the entire surface. The inversion layer 12b formed over the entire surface on the inner side from the second gate conductor layer 5b to which the word line WL is connected substantially functions as the drain of the first N-channel MOS transistor region including the first gate conductor layer 5a. As a result, the electric field becomes maximum in the boundary region (first boundary region) of the channel region 7 between the first N-channel MOS transistor region including the first gate conductor layer 5a and the second N-channel MOS transistor region including the second gate conductor layer 5b that are connected in series, and an impact ionization phenomenon occurs in this region. This region is a region on the source side when viewed from the second N-channel MOS transistor region including the second gate conductor layer 5b to which the word line WL is connected, and thus this phenomenon is referred to as a source-side impact ionization phenomenon. The source-side impact ionization phenomenon causes electrons to flow from the $N^+$ layer 3a to which the source line SL is connected toward the $N^+$ layer 3b to which the bit line BL is connected. Accelerated electrons collide with lattice Si atoms, and the kinetic energy thereof generates electron-hole pairs. Some of the generated electrons flow to the first gate conductor layer 5a and the second gate conductor layer 5b, but most of the electrons flow to the $N^+$ layer 3b to which the bit line BL is connected. In "1" writing, electron-hole pairs may be generated using a gate induced drain leakage (GIDL) current (see NPL 11), and the floating body FB may be filled with the generated hole group. Generation of electron-hole pairs by an impact ionization phenomenon can be performed near the boundary between the $N^+$ layer 3a and the channel region 7 or the boundary between the $N^+$ layer 3b and the channel region 7.

As illustrated in FIG. 3B, the generated hole group 11 is a majority carrier in the channel region 7 and charges the channel region 7 to a positive bias. The $N^+$ layer 3a to which the source line SL is connected is at 0 V, and thus the channel region 7 is charged to the built-in voltage Vb (about 0.7 V) of the PN junction between the $N^+$ layer 3a to which the source line SL is connected and the channel region 7. Upon the channel region 7 being charged to a positive bias, the threshold voltages of the first N-channel MOS transistor region and the second N-channel MOS transistor region are decreased by a substrate bias effect. Accordingly, as illustrated in FIG. 3C, the threshold voltage of the N-channel MOS transistor in the second channel region 7b to which the word line WL is connected decreases. The write state of the channel region 7 is assigned to logical storage data "1".

At the time of the write operation, in a second boundary region between the first impurity layer and a first channel semiconductor layer or in a third boundary region between the second impurity layer and a second channel semiconductor layer, electron-hole pairs may be generated by an impact ionization phenomenon or a GIDL current, and the channel region 7 may be charged with the generated hole group 11, instead of the first boundary region. The above-described conditions of the voltages applied to the bit line BL, the source line SL, the word line WL, and the plate line PL are examples for performing a write operation, and other operation conditions for performing the write operation may be used.

Figure 4A:
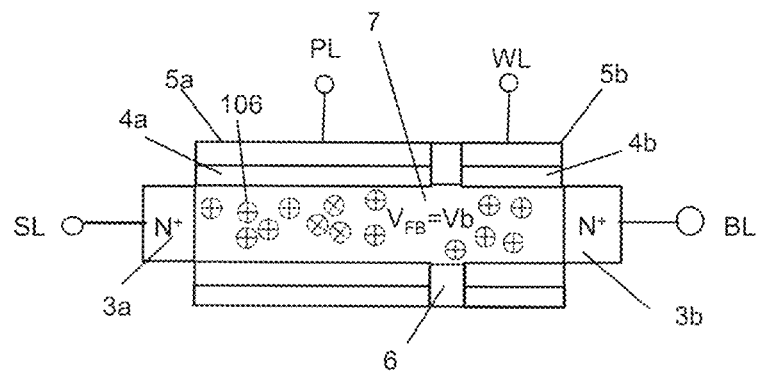
FIGS. 4AA, 4AB and 4AC are diagrams for describing a read operation mechanism of the dynamic flash memory device according to the first embodiment.
Figure 4A:
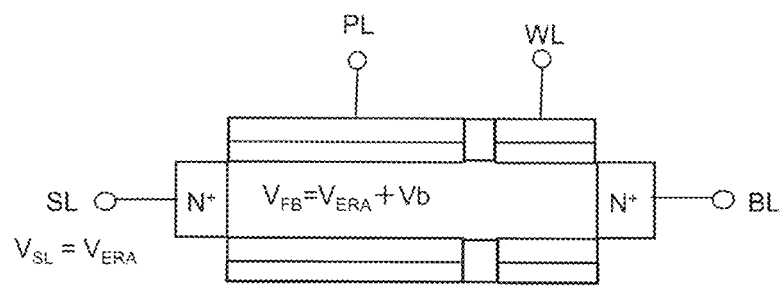
Figure 4A:
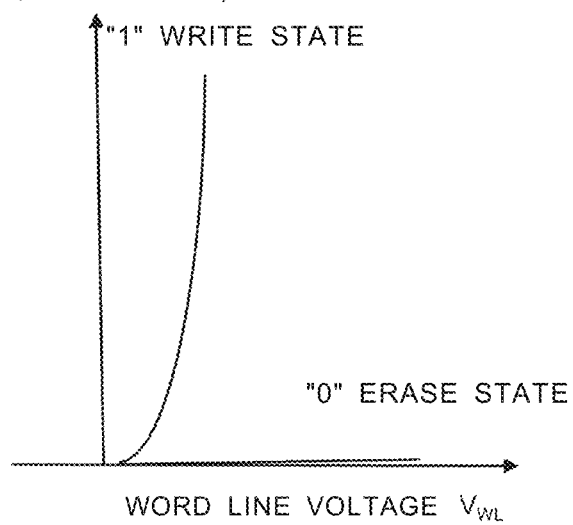

A read operation of the dynamic flash memory cell according to the first embodiment of the present invention and a memory cell structure related thereto will be described with reference to FIGS. 4AA-4AC and FIGS. 4BA-4BD. The read operation of the dynamic flash memory cell will be described with reference to FIG. 4AA to FIG. 4AC. As illustrated in FIG. 4AA, upon the channel region 7 being charged to the built-in voltage Vb (about 0.7 V), the threshold voltage of the N-channel MOS transistor is decreased by a substrate bias effect. This state is assigned to logical storage data "1". As illustrated in FIG. 4AB, when the memory block selected before writing is in an erase state "0" in advance, the channel region 7 is at a floating voltage $V_{FB}$, which is $V_{ERA}$+Vb. The write operation causes a write state "1" to be randomly stored. As a result, logical storage data of logical "0" and "1" is generated for the word line WL. As illustrated in FIG. 4AC, reading is performed by a sense amplifier by using a difference between two threshold voltages for the word line WL.

Figure 4B:
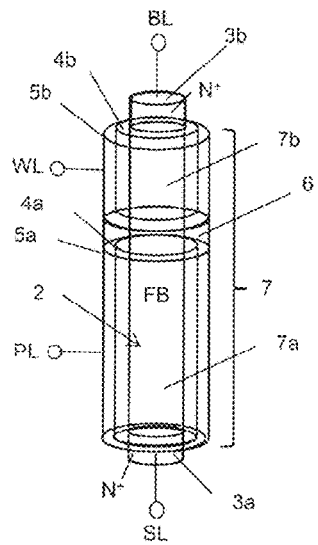
FIGS. 4BA, 4BB, 4BC and 4BD are diagrams for describing a read operation mechanism of the dynamic flash memory device according to the first embodiment.
Figure 4B:
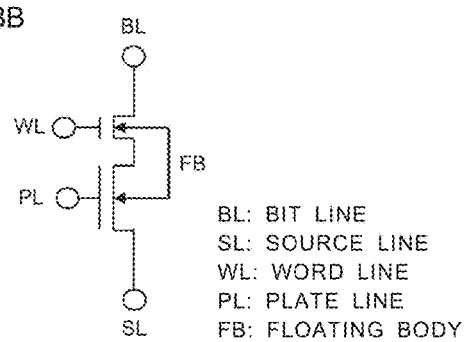
Figure 4B:
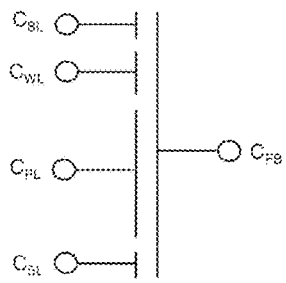
Figure 4B:
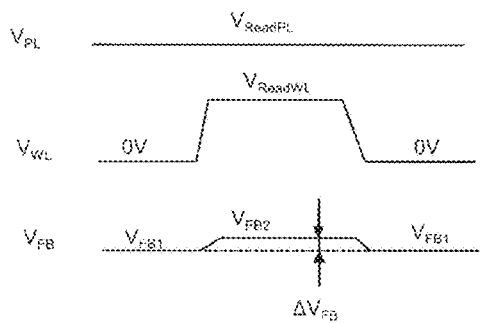

With reference to FIG. 4BA) to FIG. 4BD, a description will be given of the magnitude relationship between the two gate capacitances of the first gate conductor layer 5a and the second gate conductor layer 5b at the time of a read operation of the dynamic flash memory cell according to the first embodiment of the present invention, and the operation related thereto. The gate capacitance of the second gate conductor layer 5b to which the word line WL is connected is desirably designed so as to be smaller than the gate capacitance of the first gate conductor layer 5a to which the plate line PL is connected. As illustrated in FIG. 4BA, the length in the perpendicular direction of the first gate conductor layer 5a to which the plate line PL is connected is made longer than the length in the perpendicular direction of the second gate conductor layer 5b to which the word line WL is connected, so that the gate capacitance of the second gate conductor layer 5b to which the word line WL is connected is made smaller than the gate capacitance of the first gate conductor layer 5a to which the plate line PL is connected. FIG. 4BB illustrates an equivalent circuit of one cell of the dynamic flash memory illustrated in FIG. 4BA. FIG. 4BC illustrates a coupling capacitance relationship of the dynamic flash memory. Here, $C_{WL}$ is the capacitance of the second gate conductor layer 5b, $C_{PL}$ is the capacitance of the first gate conductor layer 5a, $C_{BL}$ is the capacitance of the PN junction between the N⁺ layer 3b serving as a drain and the second channel region 7b, and $C_{SL}$ is the capacitance of the PN junction between the N⁺ layer 3a serving as a source and the first channel region 7a. As illustrated in FIG. 4BD, when the voltage of the word line WL oscillates, the operation affects the channel region 7 as noise. A potential variation $\Delta V_{FB}$ of the channel region 7 at this time is expressed by the following equation.

$$\Delta V_{FB} = C_{WL}/(C_{PL}+C_{WL}+C_{BL}+C_{SL}) \times V_{ReadWL} \qquad (1)$$

Here, $V_{ReadWL}$ is the oscillation potential of the word line WL at the time of reading. As is apparent from equation (1), $\Delta V_{FB}$ decreases as the contribution ratio of $C_{WL}$ decreases relative to the total capacitance $C_{PL}+C_{WL}+C_{BL}+C_{SL}$ of the channel region 7. $C_{BL}+C_{SL}$ is the capacitance of the PN junction. To increase the capacitance, for example, the diameter of the Si pillar 2 is increased. However, this is not desirable for miniaturization of the memory cell. In contrast, the length in the perpendicular direction of the first gate conductor layer 5a to which the plate line PL is connected may be further longer than the length in the perpendicular direction of the first gate conductor layer 5b to which the word line WL is connected, and thereby $\Delta V_{FB}$ can be further decreased without decreasing the degree of integration of the memory cells in plan view. The above-described conditions of the voltages applied to the bit line BL, the source line SL, the word line WL, and the plate line PL are examples for performing a read operation, and other operation conditions for performing the read operation may be used.

Figure 5A:
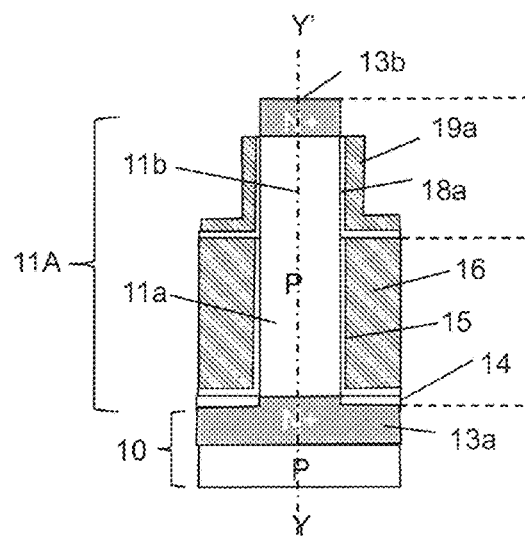
FIGS. 5A, 5B, 5C and 5D are diagrams for describing the structures of a dynamic flash memory cell according to the first embodiment and an SGT transistor used for a driving circuit and a signal processing circuit of the dynamic flash memory cell.
Figure 5C:
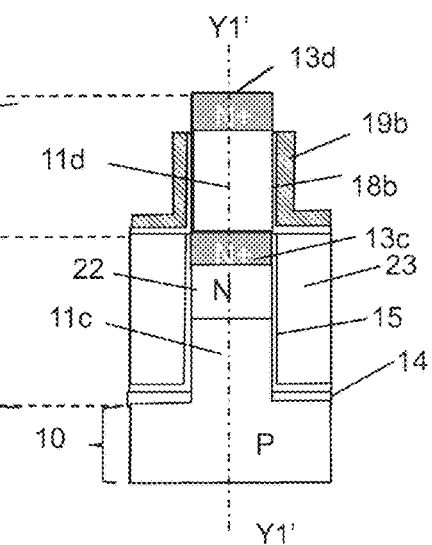
Figure 5B:
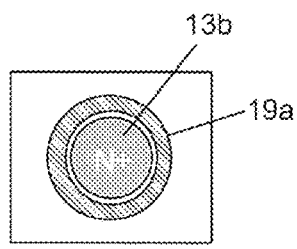
Figure 5D:
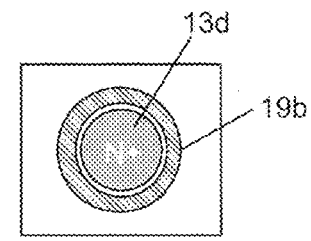

With reference to FIGS. 5A-5D, a description will be given of the structure of the memory cell of the dynamic flash memory according to the present embodiment, and an N-channel SGT transistor used for a driving circuit and a signal processing circuit of the memory cell. FIG. 5A is a perpendicular sectional view of the dynamic flash memory, and FIG. 5B is a plan view of FIG. 5A. FIG. 5C is a perpendicular sectional view of the SGT transistor, and FIG. 5D is a plan view of FIG. 5C. The memory cell of the dynamic flash memory and the SGT transistor are on the same P-layer substrate 10.

As illustrated in FIG. 5A and FIG. 5B, the substrate 10 (an example of "substrate" in the claims) is composed of a P layer 10 (hereinafter, a semiconductor region containing an acceptor impurity will be referred to as a "P layer") and an N⁺ layer 13a (an example of "first impurity layer" in the claims) connected to the P layer 10. A Si pillar 11A (an example of "first semiconductor pillar" in the claims) is connected to the N⁺ layer 13a. An N⁺ layer 13b (an example of "second impurity layer" in the claims) is at a top portion of the Si pillar 11A. A SiO₂ layer 14 is on the N⁺ layer 13a in an outer periphery portion of the Si pillar 11A. A HfO₂ layer 15 (an example of "first gate insulating layer" in the claims) surrounds a lower side surface of the Si pillar 11A. A TiN layer 16 (an example of "first gate conductor layer" in the claims) surrounds a side surface of the HfO₂ layer 15. A HfO₂ layer 18a (an example of "second gate insulating layer" in the claims) is on a side surface of the Si pillar 11A between an upper end of the HfO₂ layer 15 and a lower end of the N⁺ layer 13b, and on an upper surface of the TiN layer 16. A TiN layer 19a (an example of "second gate conductor layer" in the claims) surrounds the HfO₂ layer 18a. The N⁺ layer 13a is connected to the source line SL illustrated in FIG. 1, the N⁺ layer 13b is connected to the bit line BL, the TiN layer 16 is connected to the plate line PL, and the TiN layer 19a is connected to the word line WL. The channel layer of the Si pillar 11A sandwiched between the N⁺ layers 13a and 13b is composed of a first channel layer 11a surrounded by the HfO₂ layer 15 and a second channel layer 11b surrounded by the HfO₂ layer 18a.

As illustrated in FIG. 5C and FIG. 5D, a Si pillar 11B (an example of "second semiconductor pillar" in the claims) is on the substrate 10 composed of a P layer. The Si pillar 11B is composed of a P layer 11c, an N layer 22, an N⁺ layer 13c (an example of "third impurity layer" in the claims), a P layer 11d, and an N⁺ layer 13d (an example of "fourth impurity layer" in the claims) from below. The SiO₂ layer 14 is in a lower portion of the Si pillar 11B and on the P-layer substrate 10 in an outer periphery portion of the Si pillar 11B. The HfO₂ layer 15 surrounds a lower side surface of the Si pillar 11B. A SiO₂ layer 23 surrounds the HfO₂ layer 15. An upper surface position of the SiO₂ layer 23 is near an upper surface position of the TiN layer 16. A HfO₂ layer 18b (an example of "third gate insulating layer" in the claims) surrounds an upper portion of the Si pillar 11B and is connected to an upper surface of the SiO₂ layer 23. A TiN layer 19b (an example of "third gate conductor layer" in the claims) surrounds the HfO₂ layer 18b. The N⁺ layers 13c and 13d each serve as the source or drain of the SGT transistor. The HfO₂ layer 18b serves as a gate insulating layer. The TiN layer 19b serves as a gate conductor layer. The N layer 22 and the P layer 11c serve as an electrical division layer for the P-channel and N-channel SGTs formed on the same P-layer substrate 10. The P layer 11c, the N layer 22, and the N⁺ layer 13c may be wider than the P layer 11d and the N⁺ layer 13d in plan view. In this case, in plan view, a contact hole may be formed on the N⁺ layer 13c that is on an outer side from the P layer 11c, and an external lead wiring layer may be formed through the contact hole. The SiO₂ layer 14 and the HfO₂ layer 15 at a portion surrounded by the SiO₂ layer 23 do not contribute to the operation of the SGT transistor, and thus may be removed.

The Si pillar 11A of the dynamic flash memory illustrated in FIG. 5A and FIG. 5B and the Si pillar 11B of the SGT transistor illustrated in FIG. 5C and FIG. 5D are both on the same substrate 10. The Si pillar 11A and the Si pillar 11B have the same height at the bottom surface position A.

The Si pillar 11A of the dynamic flash memory and the Si pillar 11B of the SGT transistor are both divided into two regions near position B in the perpendicular direction. The Si pillar 11A is composed of the first channel layer 11a surrounded by the HfO₂ layer 15, the second channel layer 11b surrounded by the HfO₂ layer 18a, and the N⁺ layer 13b. The Si pillar 11B is composed of a region composed of the P layer 11c, the N layer 22, and the N⁺ layer 13c surrounded by the SiO₂ layer 23, and the channel layer 11d and the N⁺ layer 13d of a Fin transistor. The gate insulating HfO₂ layer 18a, the gate conductor layer TiN layer 19a, and the N⁺ layer 13b serving as a source or drain of the dynamic flash memory, and the gate insulating HfO₂ layer 18b, the gate conductor layer TiN layer 19b, and the N⁺ layer 13d serving as a source or drain of the SGT transistor, are formed at substantially the same position in the perpendicular direction above position B.

The Si pillar 11A of the dynamic flash memory and the Si pillar 11B of the SGT transistor have the same height A-C.

The Si pillar 2 in FIG. 1 and the Si pillars 11A and 11B in FIGS. 5A-5D may have a horizontal sectional shape that is circular, elliptical, or rectangular, so as to perform the dynamic flash memory operation and the SGT transistor operation described in the present embodiment. Circular, elliptical, and rectangular dynamic flash memory cells and SGT transistors may be disposed together on the same chip.

In the description with reference to FIG. 5A and FIG. 5C, the upper surface positions of the Si pillars 11A and 11B correspond to the upper surface positions of the N$^+$ layers 13b and 13d. However, in a case where the N$^+$ layers 13b and 13d are formed by, for example, epitaxial crystal growth after the TiN layers 19a and 19b have been formed, the lower ends of the N$^+$ layers 13b and 13d correspond to the upper surfaces of the Si pillars 11A and 11B.

The gate insulating HfO$_2$ layer 18a and the gate conductor layer TiN layer 19a of the dynamic flash memory, and the gate insulating HfO$_2$ layer 18b and the gate conductor layer TiN layer 19b of the SGT transistor, may be formed separately or formed with different material layers.

In FIG. 1, a description has been given that the first gate conductor layer 5a is connected to the plate line PL, and the second gate conductor layer 5b is connected to the word line WL. Alternatively, the first gate conductor layer 5a may be connected to the word line WL, and the second gate conductor layer 5b may be connected to the plate line PL. Also in this case, a normal dynamic flash memory operation can be performed. In this case, in FIGS. 5A-5D, the first gate conductor layer 16 is connected to the word line. Thus, in memory cells adjacent to each other in a direction perpendicular to the wiring of the bit line BL in plan view, the gate conductor layers at the positions of the first gate conductor layers are connected to the word line. Similarly, a description has been given in FIG. 1 that the N$^+$ layer 3a is connected to the source line SL and the N$^+$ layer 3b is connected to the bit line BL. Alternatively, the N$^+$ layer 3a may be connected to the bit line BL and the N$^+$ layer 3b may be connected to the source line SL. Also in this case, a normal dynamic flash memory operation can be performed.

In addition, the first gate conductor layer 5a and the second gate conductor layer 5b in FIG. 1 may surround a part of the first gate insulating layer 4a and a part of the second gate insulating layer 4b. Also in this case, a dynamic flash memory operation can be performed. In addition, each of the first gate conductor layer 5a and the second gate conductor layer 5b may be divided into a plurality of conductor layers to be operated.

In FIG. 1, a description has been given of the N$^+$ layers 3a and 3b and the Si pillar 2 in which the channel region 7 is of P type. Alternatively, the N$^+$ layers 3a and 3b may be replaced with P$^+$ layers, and the Si pillar 2 may be changed from a P layer to an N layer. In this case, an operation of generating an electron group and a hole group by an impact ionization phenomenon or a gate induced drain leakage current and discharging, of the generated electron group and hole group, the hole group as a minority carrier in the N-layer channel region from the P$^+$ layer of one or both of the source and drain; a memory write operation of causing a part or the entirety of the electron group as a majority carrier in the N-layer channel region to remain in the Si pillar 2; and a memory erase operation of removing a remaining electron group of the electron group from one or both of the P$^+$ layers of the source and drain, are performed. Accordingly, a dynamic flash memory operation can be performed.

The present embodiment provides the following features.
(Feature 1)

In the plate line PL of the dynamic flash memory cell according to the first embodiment of the present invention, the voltage of the word line WL oscillates up and down when the dynamic flash memory cell performs a write or read operation. At this time, the plate line PL functions to reduce the capacitive coupling ratio between the word line WL and the channel region 7. As a result, when the voltage of the word line WL oscillates up and down, an influence of a voltage change in the channel region 7 can be significantly reduced. This makes it possible to increase the difference in the threshold voltage of the SGT transistor between the word lines WL indicating the logic "0" and "1". This leads to an increase in the operation margin of the dynamic flash memory cell.

(Feature 2)

As illustrated in FIGS. 5A-5D, the Si pillar 11A of the dynamic flash memory cell and the Si pillar 11B of the SGT transistor have the bottom portions that are at the same height A, and are formed at the same height (between A and C) on the substrate 10. The gate insulating HfO$_2$ layer 18a and the gate conductor layer TiN layer 19a of the dynamic flash memory, and the gate insulating HfO$_2$ layer 18b and the gate conductor layer TiN layer 19b of the SGT transistor, which are on the substrate 10, are at substantially the same heights. Accordingly, the dynamic flash memory cell and the SGT transistor circuit can be easily formed on the substrate 10. This leads to cost reduction in the manufacture of a semiconductor device including a dynamic flash memory.

Second Embodiment

A manufacturing method for forming a dynamic flash memory cell and an SGT transistor on the same substrate 31 according to a second embodiment of the present invention will be described with reference to FIG. 6AA to FIG. 6GB. In each figure, A is a sectional view of the dynamic flash memory cell, and B is a sectional view of the SGT transistor.

Figure 6A:
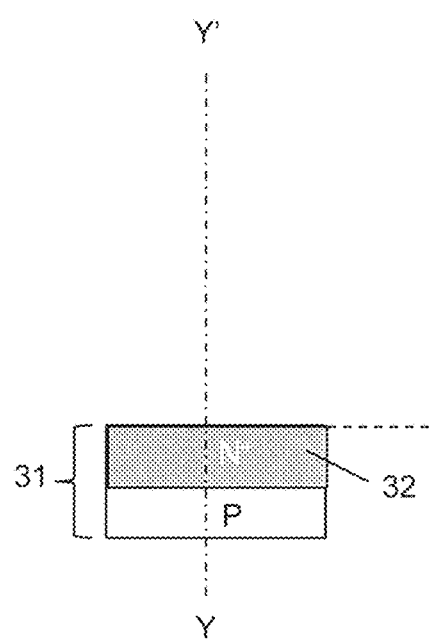
FIGS. 6AA and 6AB are diagrams for describing a manufacturing method for forming a dynamic flash memory cell and an SGT transistor on the same substrate according to a second embodiment.
Figure 6A:
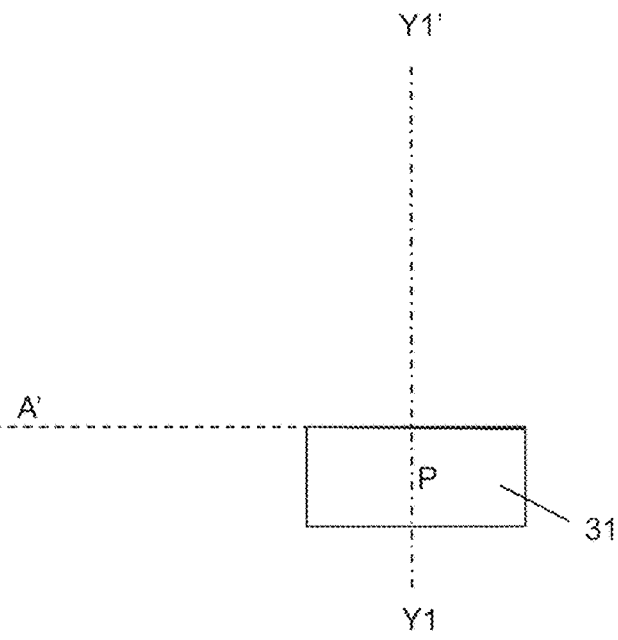

As illustrated in FIGS. 6AA-6AB, a phosphorus (P) impurity is applied by ion implantation to an upper layer of a P-layer substrate 31 in a dynamic flash memory cell region to form an N$^+$ layer 32. The N$^+$ layer 32 may be formed, for example, by etching the surface layer of the P-layer substrate 31 in the dynamic flash memory cell region and using epitaxial crystal growth. In this step, the P-layer substrate 31 outside the dynamic flash memory cell region is first covered with a SiO$_2$ layer. Subsequently, the surface layer of the P-layer substrate 31 is etched by using the SiO$_2$ layer as a mask. Subsequently, an N$^+$ layer is formed on the entire structure by epitaxial crystal growth. Subsequently, polishing is performed by using a CMP (Chemical Mechanical Polishing) method so that the surface position corresponds to the P-layer substrate 31. Accordingly, the N$^+$ layer 32 is embedded in the P-layer substrate 31. In this case, the surface position of the N$^+$ layer 32 in the dynamic flash memory cell region and the surface of the P-layer substrate 31 in the SGT transistor region coincide with each other at position A'.

Figure 6B:
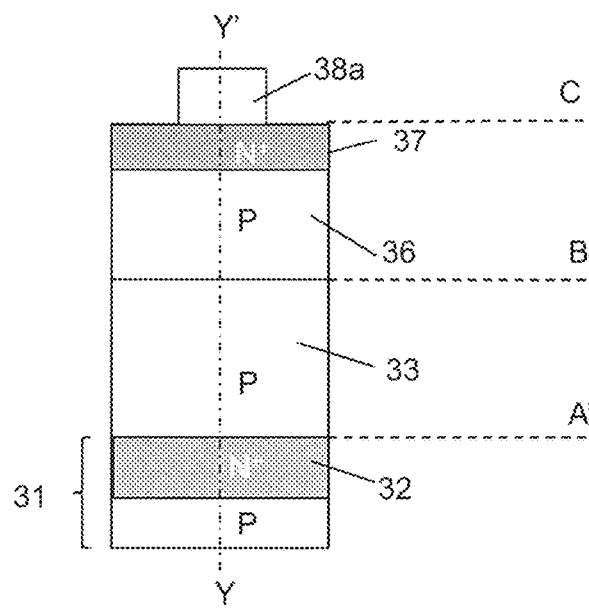
FIGS. 6BA and 6BB are diagrams for describing the manufacturing method for forming a dynamic flash memory cell and an SGT transistor on the same substrate according to the second embodiment.
Figure 6B:
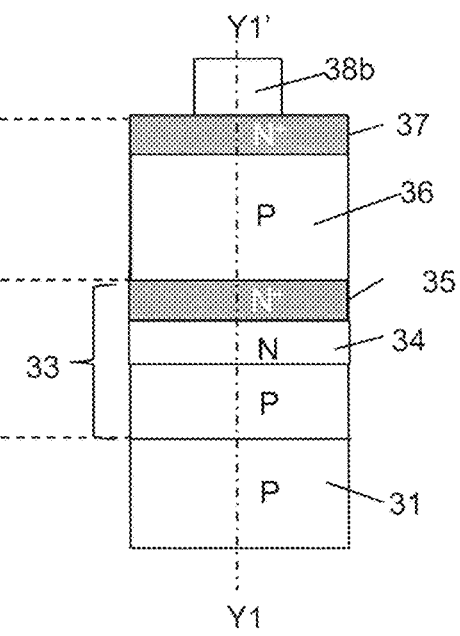

Subsequently, as illustrated in FIGS. 6BA-6BB, a P layer 33 is formed over the entire dynamic flash memory cell region and the entire SGT transistor region by epitaxial crystal growth. Subsequently, an N layer 34 and an N$^+$ layer 35 are formed from below in an upper portion of the P layer 33 in the SGT region by, for example, ion implantation. The N layer 34 and N$^+$ layer 35 may be formed in the P layer 33 in the SGT transistor region by epitaxial crystal growth in the same manner as that for forming the N$^+$ layer 32. Subsequently, a P layer 36, an N$^+$ layer 37, a first mask material layer 38a, and a second mask material layer 38b are formed from below over the entire dynamic flash memory cell region and the entire SGT transistor region.

Figure 6C:
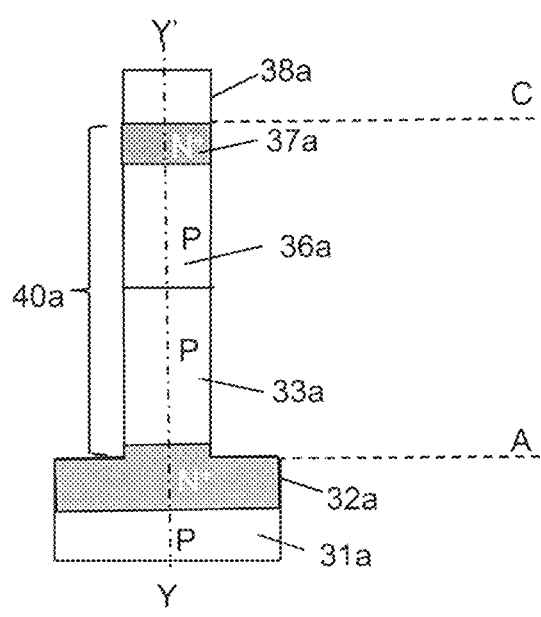
FIGS. 6CA and 6CB are diagrams for describing the manufacturing method for forming a dynamic flash memory cell and an SGT transistor on the same substrate according to the second embodiment.
Figure 6C:
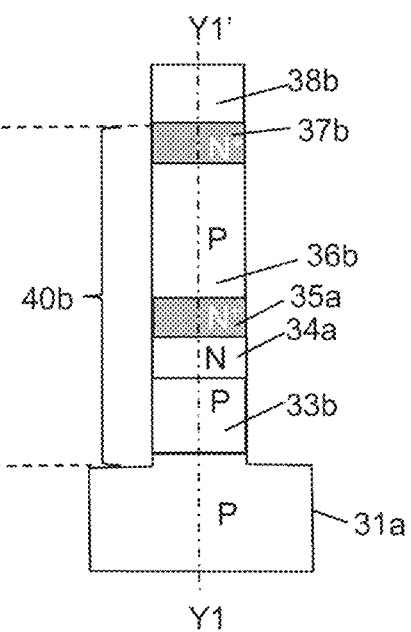

Subsequently, as illustrated in FIGS. 6CA-6CB, by using the first mask material layer 38a and the second mask material layer 38b as masks, the N+ layer 37, the P layer 36, the P layer 33, the N+ layer 35, and the N layer 34 are etched until the bottom position thereof is located near the upper surface position of an N+ layer 32a, to form Si pillars 40a and 40b.

Figure 6D:
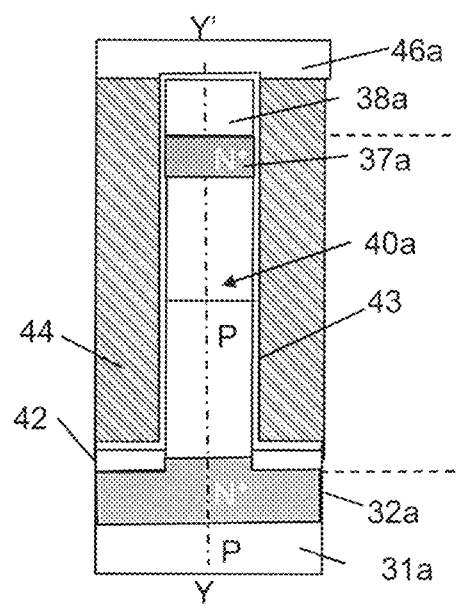
FIGS. 6DA and 6DB are diagrams for describing the manufacturing method for forming a dynamic flash memory cell and an SGT transistor on the same substrate according to the second embodiment.
Figure 6D:
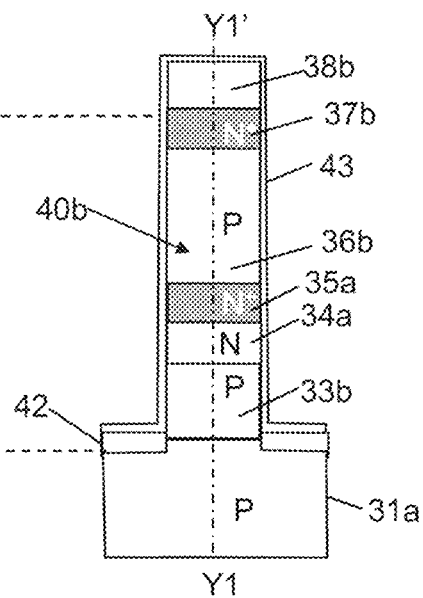

Subsequently, as illustrated in FIGS. 6DA-6DB, a SiO$_2$ layer 42 is formed on outer periphery portions of the Si pillars 40a and 40b. Subsequently, a HfO$_2$ layer 43 is formed over the entire structure. Subsequently, a TiN layer (not illustrated) is deposited on the entire structure. Subsequently, polishing is performed by a CMP method until the upper surface position is located at the upper surface positions of the mask material layers 38a and 38b. Subsequently, a mask material layer 46a is formed so as to cover the dynamic flash memory cell region. Subsequently, the TiN layer in the SGT transistor region is removed by using the mask material layer 46a as a mask. Accordingly, a TiN layer 44 is formed so as to surround the HfO$_2$ layer 43 in the dynamic flash memory cell region. The SiO$_2$ layer 42 and the HfO$_2$ layer 43 in the SGT transistor region may be removed.

Figure 6E:
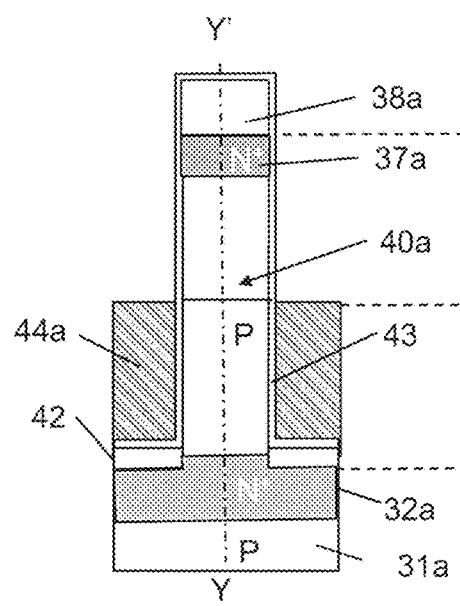
FIGS. 6EA and 6EB are diagrams for describing the manufacturing method for forming a dynamic flash memory cell and an SGT transistor on the same substrate according to the second embodiment.
Figure 6E:
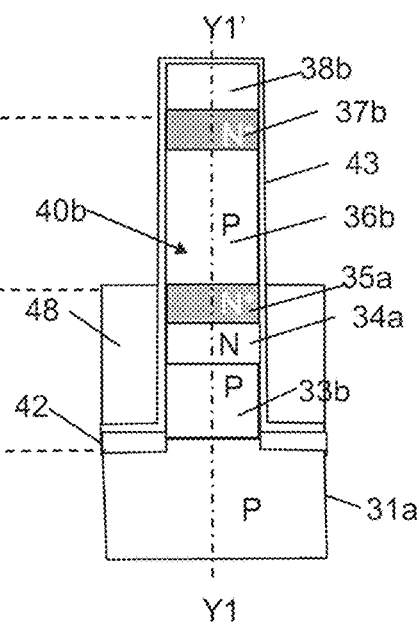

Subsequently, the entire structure is covered with a SiO$_2$ layer (not illustrated). Subsequently, the entire structure is polished by a CMP method until the upper surface position is located at the upper surface position of the mask material layer 46a. Subsequently, the entire SGT region is covered with a mask material layer (not illustrated). Subsequently, the mask material layer 46a in the dynamic flash memory cell region is removed. Subsequently, as illustrated in FIGS. 6EA-6EB, the TiN layer 44 is etched by an RIE method so that the upper surface position is located at a middle portion of the Si pillar 40a to form a TiN layer 44a. Subsequently, the mask material layer and the SiO$_2$ layer in the SGT transistor region are etched by an RIE method to form a SiO$_2$ layer 48 such that the upper surface position thereof is located at the upper surface position of the TiN layer 44a. Accordingly, the upper surface position of the TiN layer 44a and the upper surface position of the SiO$_2$ layer 48 become substantially the same at position B.

Figure 6F:
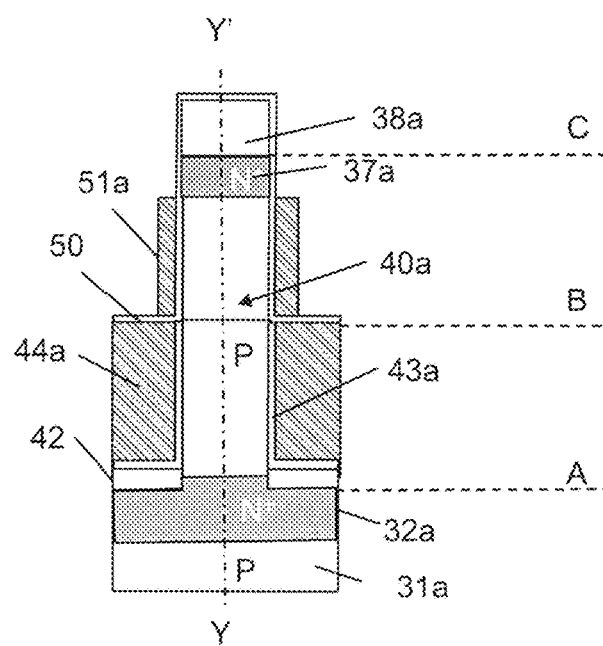
FIGS. 6FA and 6FB are diagrams for describing the manufacturing method for forming a dynamic flash memory cell and an SGT transistor on the same substrate according to the second embodiment.
Figure 6F:
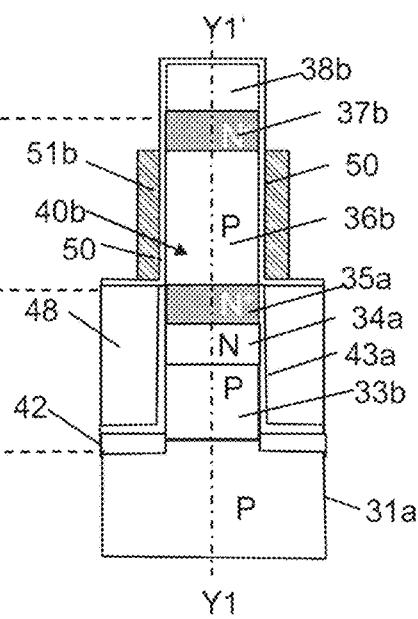

Subsequently, as illustrated in FIGS. 6FA-6FB, the HfO$_2$ layer 43 above position B covering the Si pillars 40a and 40b and the mask material layers 38a and 38b is removed, and a HfO$_2$ layer 50 surrounding the Si pillars 40a and 40b above position B is formed. Subsequently, the entire structure is covered with the HfO$_2$ layer 50. Subsequently, in the dynamic flash memory cell region, a TiN layer 51a is formed which surrounds the HfO$_2$ layer 50 and whose upper surface position is located at a lower end of an N+ layer 37a. Similarly, in the SGT transistor region, a TiN layer 51b is formed which surrounds the HfO$_2$ layer 50 and whose upper surface position is located at a lower end of an N+ layer 37b.

Figure 6G:
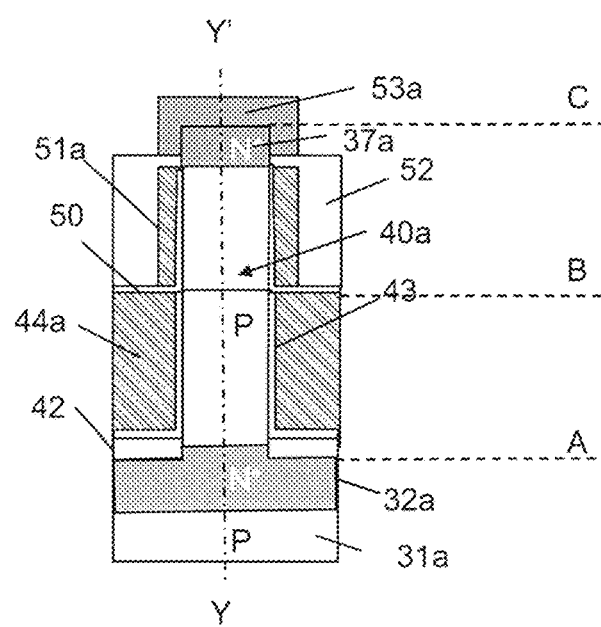
FIGS. 6GA and 6GB are diagrams for describing the manufacturing method for forming a dynamic flash memory cell and an SGT transistor on the same substrate according to the second embodiment.
Figure 6G:
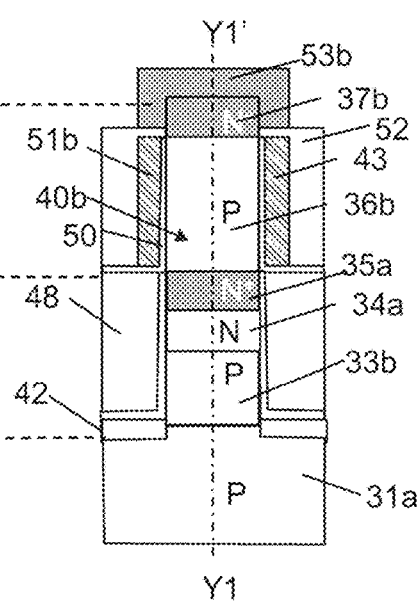
Figure 7A:
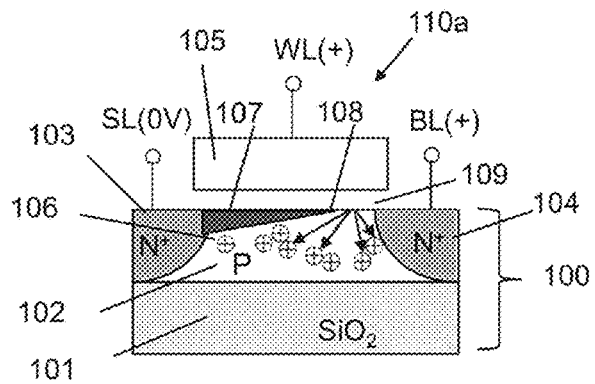
FIGS. 7A, 7B, 7C and 7D are diagrams for describing a problem in operation of a capacitorless DRAM memory cell according to the related art.
Figure 7B:
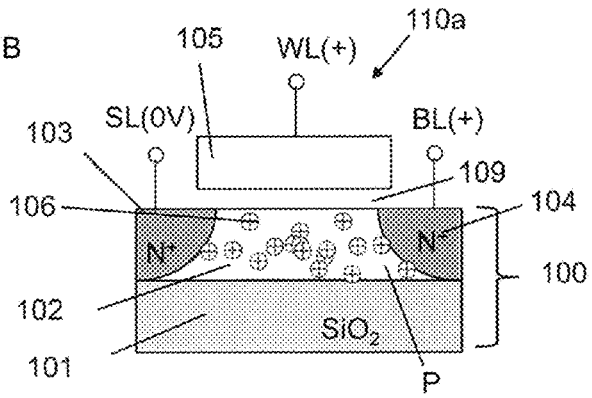
Figure 7C:
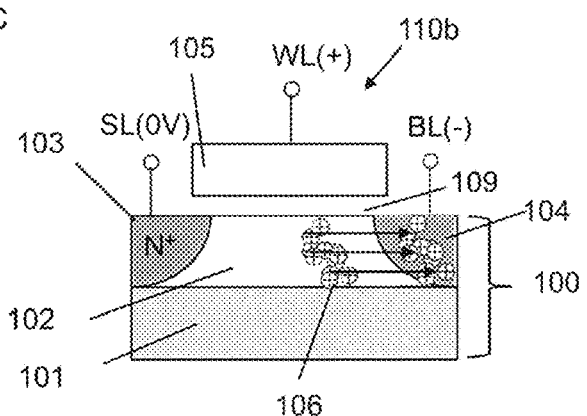
Figure 7D:
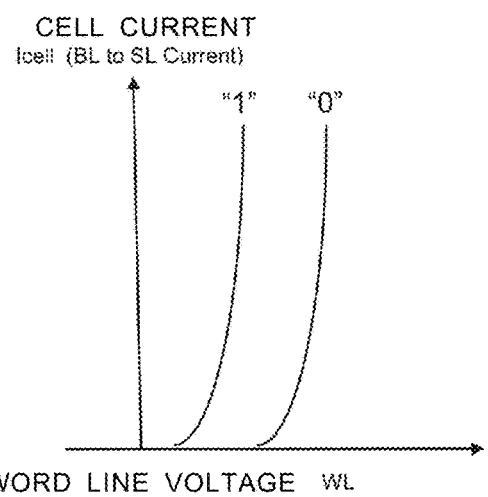
Figure 8A:
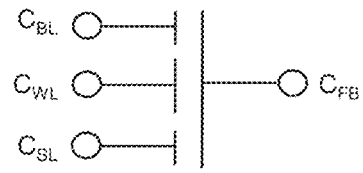
FIGS. 8A and 8B are diagrams for describing a problem in operation of the capacitorless DRAM memory cell according to the related art.
Figure 8B:
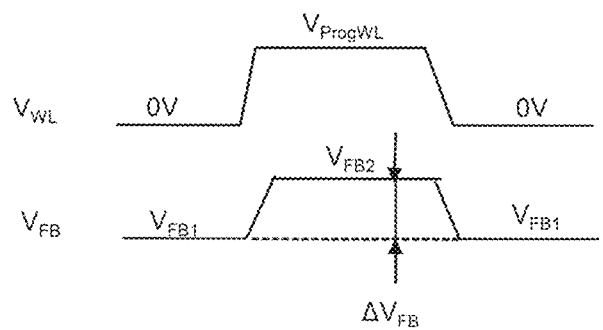
Figure 9A:
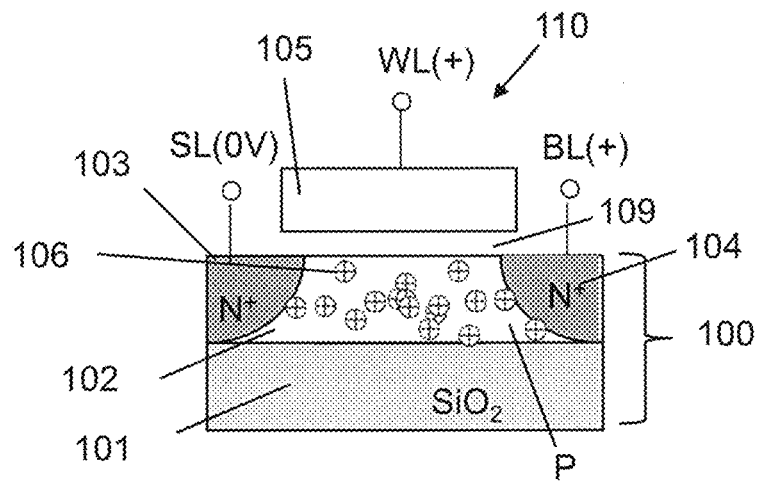
FIGS. 9A, 9B and 9C are diagrams illustrating a read operation of the capacitorless DRAM memory cell according to the related art.
Figure 9B:
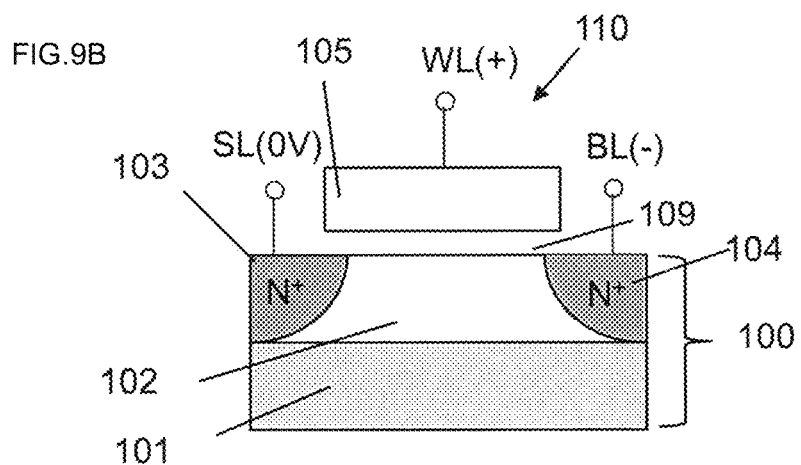
Figure 9C:
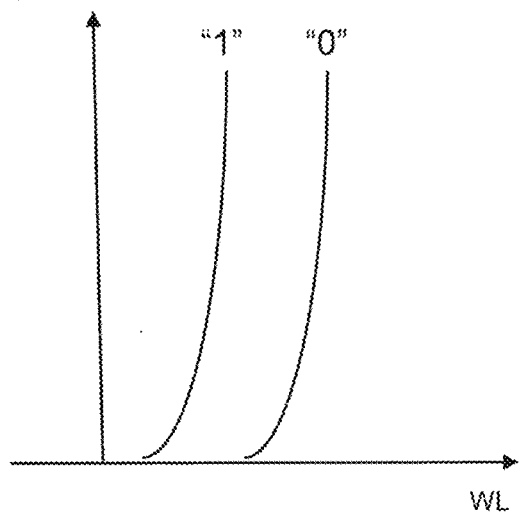

Subsequently, as illustrated in FIGS. 6GA-6GB, a SiO$_2$ layer 52 is formed which surrounds the TiN layers 51a and 51b and whose upper surface position is above upper ends of the TiN layers 51a and 51b. Subsequently, N+ layers 53a and 53b are formed by selective epitaxial crystal growth so as to surround exposed top portions of the Si pillars 40a and 40b.

Subsequently, the source line SL is connected to the N+ layer 32a, the plate line PL is connected to the TiN layer 44a, the word line WL is connected to the TiN layer 51a, and the bit line BL is connected to the N+ layer 53a, and thereby a dynamic flash memory cell is formed. Subsequently, an SGT transistor is formed in which a gate line is connected to the TiN layer 51b, one of N+ layers 35a and 35b is connected to a source line, and the other is connected to a drain line.

In the second embodiment, a description has been given of an example in which the dynamic flash memory cell and the N-channel SGT transistor are formed on the P-layer substrate 31a. A CMOS circuit is normally used in a circuit using an SGT transistor, and thus a P-channel SGT transistor is similarly formed on the P-layer substrate 31a.

Although the gate insulating layers of the dynamic flash memory cell and the SGT transistor are formed of the same HfO$_2$ layer 50 in the present embodiment, the gate insulating layers of the dynamic flash memory cell and the SGT transistor may be formed of different material layers. The same applies to the relationship with the TiN layers 51a and 51b, which are gate conductor layers in the dynamic flash memory cell.

The present embodiment provides the following features.
(Feature 1)
The Si pillar 40a of the dynamic flash memory cell and the Si pillar 40b of the SGT transistor are simultaneously formed, and thus the manufacturing process is simplified.
(Feature 2)
The TiN layer 51a of the word line gate of the dynamic flash memory cell and the gate TiN layer 51b of the SGT transistor are simultaneously formed, and thus the manufacturing process is simplified.
(Feature 3)
The N+ layers 37a and 53a connected to the bit line BL of the dynamic flash memory cell, and the N+ layers 37b and 53b serving as the source or drain of the SGT transistor are simultaneously formed, and thus the manufacturing process is simplified.
(Feature 4)
The word line transistor of the dynamic flash memory cell and the SGT transistor are formed at the same height in the perpendicular direction, and thus manufacturing is facilitated.

Other Embodiments

Although the Si pillars 2, 11A, 11B, 40a, and 40b are formed in the present invention, semiconductor pillars made of another semiconductor material may be used.

The N+ layers 3a, 3b, 13a, 13b, 13c, and 13d in the first embodiment may be formed of layers made of Si containing donor impurities or another semiconductor material. Alternatively, these layers may be formed of layers made of different semiconductor materials. The N+ layers may be formed by epitaxial crystal growth or another method. The same applies to other embodiments according to the present invention.

In the first embodiment, the TiN layer 16 is used as the gate conductor layer 5a connected to the plate line PL. Alternatively, instead of the TiN layer 16, a single conductor material layer or a combination of a plurality of conductor material layers may be used. Similarly, the word line WL, and the TiN layer 19a as the gate conductor layer 5b connected to the word line WL, are used. Alternatively, instead of the TiN layers 16 and 19a, a single conductor material layer or a combination of a plurality of conductor material layers may be used. In addition, the outer sides of the gate TiN layers 16 and 19a may be connected to a wiring metal layer such as W. The same applies to the gate TiN layer 19b of the SGT transistor. The same applies to other embodiments according to the present invention.

In the first embodiment, the Si pillars 2, 11A, and 11B have a circular shape in plan view. The Si pillars 2, 11A, and 11B may have a circular shape, an elliptical shape, a shape elongated in one direction, or the like in plan view. Also in a logic circuit region formed apart from the dynamic flash memory cell region, an SGT transistor can be formed by using Si pillars having different shapes in plan view in the logic circuit region in accordance with logic circuit design. In the logic circuit, a CMOS circuit including N-channel and P-channel SGT transistors is formed. The same applies to other embodiments according to the present invention.

In FIGS. 5A-5D, a description has been given using the Si pillars 11A and 11B having rectangular perpendicular sections, but the perpendicular sections may have a trapezoidal shape. In the Si pillar 11A of the dynamic flash memory cell, the perpendicular section of the Si pillar 11A surrounded by the HfO$_2$ layer 15 and the perpendicular section of the Si pillar 11A surrounded by the HfO$_2$ layer 18a may be different from each other, that is, rectangular and trapezoidal, respectively. The same applies to the Si pillar 11B of the SGT transistor. The same applies to other embodiments according to the present invention.

Like the substrate 1, the substrates 10 and 31 may each be made of SOI (Silicon On Insulator), single-layer or multi-layer Si, or another semiconductor material. The substrates 1, 10, and 31a may each be a well layer composed of a single N or P layer or a plurality of N or P layers.

The HfO$_2$ layer 15 described in the first embodiment may be another insulating layer composed of a single layer or a plurality of layers as long as it functions as a gate insulating layer. The TiN layers 16, 19a, and 19b may each be another conductor layer composed of a single layer or a plurality of layers as long as it functions as a gate conductor layer. The HfO$_2$ layers 15, 18a, and 18b may be formed of material layers having different physical values, such as materials or thicknesses. The same applies to other embodiments according to the present invention.

In FIGS. 5A-5D, the N$^+$ layer 13a may be connected to an N$^+$ layer at the bottom portion of the Si pillar of an adjacent memory cell. The N$^+$ layer 13a may be electrically isolated from the N$^+$ layer of the adjacent memory cell by using, for example, STI (Shallow Trench Isolation) or a well structure. In this case, it is necessary to provide a low-resistance conductor layer in contact with each of the N$^+$ layers isolated from each other. This makes it possible to independently drive the isolated N$^+$ layers connected to the source line. The same applies to other embodiments according to the present invention.

Although the perpendicular section of the Si pillar 11A is rectangular in FIG. 5A, the perpendicular section may be trapezoidal. The perpendicular sections of the lower channel region 11a and the upper channel region 11b of the Si pillar 11A may be rectangular or trapezoidal. Similarly, in the Si pillar 11B of the SGT transistor, the same applies to the shapes of the perpendicular sections of the region sandwiched between the N$^+$ layers 13c and 13d and the region below the N$^+$ layer 13c. The same applies to other embodiments according to the present invention.

In FIG. 1, by making the gate length of the first gate conductor layer 5a longer than gate length of the second gate conductor layer 5b so that the gate capacitance of the first gate conductor layer 5a connected to the plate line PL becomes higher than the gate capacitance of the second gate conductor layer 5b connected to the word line WL, the gate capacitance of the first gate conductor layer 5a can further be made higher than the gate capacitance of the second gate conductor layer 5b. Also in a structure in which the gate length of the first gate conductor layer 5a is longer than or not longer than the gate length of the second gate conductor layer 5b, the thickness of the gate insulating film of the first gate insulating layer 4a is made smaller than the thickness of the gate insulating film of the second gate insulating layer 4b by changing the thicknesses of the respective gate insulating layers, and accordingly the gate capacitance of the first gate conductor layer 5a can be made higher than the gate capacitance of the second gate conductor layer 5b. The permittivity of the gate insulating film of the first gate insulating layer 4a may be made higher than the permittivity of the gate insulating film of the second gate insulating layer 4b by changing the permittivities of the materials of the respective gate insulating layers. The gate capacitance of the first gate conductor layer 5a may be made higher than the gate capacitance of the second gate conductor layer 5b by combining the lengths of the gate conductor layers 5a and 5b and the film thicknesses or permittivities of the gate insulating layers 4a and 4b. The same applies to other embodiments according to the present invention.

In the present invention, various embodiments and modifications can be made without departing from the broad spirit and scope of the present invention. The above-described embodiments are for explaining an example of the present invention, and do not limit the scope of the present invention. The above-described embodiments and modifications can be combined as appropriate. Furthermore, the above-described embodiments from which one or some of the features are removed as appropriate are also within the scope of the technical idea of the present invention.

INDUSTRIAL APPLICABILITY

According to the memory-element-including semiconductor device according to the present invention, a high-density and high-performance semiconductor device including a dynamic flash memory can be obtained.

The invention claimed is:
1. A memory-element-including semiconductor device comprising a dynamic flash memory cell and an SGT transistor, wherein
the dynamic flash memory cell includes
a first semiconductor pillar standing on a substrate in a direction perpendicular to the substrate,
a first impurity layer connected to a bottom portion of the first semiconductor pillar,
a second impurity layer disposed at or connected to a top portion of the first semiconductor pillar,
a first gate insulating layer surrounding a lower portion of the first semiconductor pillar and being in contact with the first impurity layer,
a second gate insulating layer being in contact with the first gate insulating layer and surrounding an upper portion of the first semiconductor pillar,
a first gate conductor layer surrounding a part or an entirety of the first gate insulating layer,
a second gate conductor layer surrounding a part or an entirety of the second gate insulating layer, and
a first insulating layer disposed between the first gate conductor layer and the second gate conductor layer,
the dynamic flash memory cell is configured to perform a memory write operation, a memory erase operation, and a memory read operation by controlling voltages to be applied to the first impurity layer, the second impurity layer, the first gate conductor layer, and the second gate conductor layer,
the SGT transistor includes
a second semiconductor pillar standing on the substrate in a direction perpendicular to the substrate, a second insulating layer surrounding a lower portion of the second semiconductor pillar, a third impurity layer disposed in a region of the second semiconductor pillar, the region being surrounded by an upper portion of the second insulating layer, a fourth impurity layer connected to an upper end of the second semiconductor pillar, a third gate insulating layer surrounding a region of the second semiconductor pillar, the region being between the third impurity layer and the fourth impurity layer, and a third gate conductor layer surrounding the third gate insulating layer, and bottom portions of the first semiconductor pillar and the second semiconductor pillar are disposed at the same position in the perpendicular direction, and top portions of the first semiconductor pillar and the second semiconductor pillar are disposed at the same position in the perpendicular direction.

2. The memory-element-including semiconductor device according to claim 1, wherein a lower-end position of the second gate conductor layer and a lower-end position of the third gate conductor layer are the same in the perpendicular direction.

3. The memory-element-including semiconductor device according to claim 1, wherein the second impurity layer and the fourth impurity layer are at the same position in the perpendicular direction.

4. The memory-element-including semiconductor device according to claim 1, wherein the second impurity layer and the fourth impurity layer contain the same donor impurity atoms and are made of the same semiconductor base material.

5. The memory-element-including semiconductor device according to claim 1, wherein the dynamic flash memory cell is configured to perform an operation of generating an electron group and a hole group in the first semiconductor pillar by causing an impact ionization phenomenon using a current flowing between the first impurity layer and the second impurity layer or by causing a gate induced drain leakage current; the memory write operation of discharging, of the electron group and the hole group that have been generated, the electron group or the hole group as a minority carrier from the first semiconductor pillar and causing the hole group or the electron group as a majority carrier to remain in the first semiconductor pillar; and the memory erase operation of discharging the hole group or the electron group as a majority carrier from the first semiconductor pillar.

6. The memory-element-including semiconductor device according to claim 1, wherein a first gate capacitance between the first gate conductor layer and the first semiconductor pillar is higher than a second gate capacitance between the second gate conductor layer and the first semiconductor pillar.

7. The memory-element-including semiconductor device according to claim 1, wherein the first impurity layer and the second impurity layer are each an N-type semiconductor layer containing a large number of donor impurities, and the first semiconductor pillar is a P-type semiconductor layer containing an acceptor impurity.

* * * * *